United States Patent
van der Straten et al.

(10) Patent No.: US 10,580,966 B1
(45) Date of Patent: Mar. 3, 2020

(54) FACETED SIDEWALL MAGNETIC TUNNEL JUNCTION STRUCTURE

(71) Applicant: International Business Machines Corporation, Armonk, NY (US)

(72) Inventors: Oscar van der Straten, Guilderland Center, NY (US); Alexander Reznicek, Troy, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/124,937

(22) Filed: Sep. 7, 2018

(51) Int. Cl.
| | |
|---|---|
| *H01L 43/02* | (2006.01) |
| *H01L 27/22* | (2006.01) |
| *H01L 43/10* | (2006.01) |
| *H01L 43/12* | (2006.01) |
| *H01L 43/08* | (2006.01) |
| *G11C 11/16* | (2006.01) |

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01); *G11C 11/161* (2013.01)

(58) Field of Classification Search
None
See application file for complete search history.

(56) References Cited

U.S. PATENT DOCUMENTS

| | | | |
|---|---|---|---|
| 6,518,071 B1* | 2/2003 | Durlam | H01L 43/12 438/3 |
| 6,930,866 B2 | 8/2005 | Jayasekara | |
| 8,173,551 B2* | 5/2012 | Bai | H01L 21/02381 438/758 |
| 8,203,809 B2 | 6/2012 | Zhou | |
| 8,729,647 B2 | 5/2014 | Lee | |
| 8,766,383 B2 | 7/2014 | Apalkov | |
| 8,780,665 B2 | 7/2014 | Apalkov | |
| 8,796,795 B2 | 8/2014 | Satoh | |
| 8,828,829 B2* | 9/2014 | Joung | H01L 21/7682 438/294 |
| 9,025,368 B2 | 5/2015 | Saida | |
| 9,166,154 B2 | 10/2015 | Satoh | |
| 9,705,071 B2 | 7/2017 | Annunziata | |
| 10,103,198 B2* | 10/2018 | Kashiwada | H01L 27/228 |

OTHER PUBLICATIONS

Perrissin et al., "Highly thermally stable sub-20nm magnetic random-access memory based on perpendicular shape anisotropy," Nanoscale, first published on May 18, 2018, 15 pages, Issue 25.

* cited by examiner

*Primary Examiner* — Chandra Chaudhari
(74) *Attorney, Agent, or Firm* — Scully, Scott, Murphy & Presser, P.C.; L. Jeffrey Kelly, Esq.

(57) ABSTRACT

A magnetic tunnel junction (MTJ) structure having faceted sidewalls is formed on a conductive landing pad that is present on a surface of an electrically conductive structure embedded in a dielectric material layer. No metal ions are re-sputtered onto the sidewalls of the MTJ structure during the patterning of the MTJ material stack that provides the MTJ structure. The absence of re-sputtered metal on the MTJ structure sidewalls reduces the risk of shorts.

9 Claims, 5 Drawing Sheets

FACETED SIDEWALL MAGNETIC TUNNEL JUNCTION STRUCTURE

BACKGROUND

The present application relates to a semiconductor structure and a method of forming the same. More particularly, the present application relates to a semiconductor structure including an embedded high performance magnetoresistive random access memory (MRAM) device that exhibits reduced shorting.

MRAM is a non-volatile random access memory technology in which data is stored by magnetic storage elements. These elements are typically formed from two ferromagnetic plates, each of which can hold a magnetization, separated by a thin dielectric layer. One of the two plates is a permanent magnetic set to a particular polarity; the other plate's magnetization can be changed to match that of an external field to store memory. Such a configuration is known as magnetic tunnel junction (MTJ).

For high performance MRAM based on perpendicular MTJ structures, well defined interfaces and interface control are essential. MTJ structures typically include a cobalt (Co)-based synthetic anti-ferromagnet (SAF), a cobalt-iron-boron (CoFeB)-based reference layer, a magnesium oxide (MgO)-based tunnel barrier, a CoFeB-based free layer, and capping layers containing, for example, tantalum (Ta) and/or ruthenium (Ru). Embedded MTJ structures are usually formed by patterning of blanket MTJ stacks. Reactive ion etch (RIE) processing and ion beam etch (IBE) processing of such MTJ stacks presents a major challenge, as such processing typically leads to shorts due to re-sputtering of thick bottom metal layers onto the MTJ stack sidewalls. There is thus a need for embedded MTJ structures formed by a method with a reduced risk of shorts due to metal re-sputtering.

SUMMARY

A magnetic tunnel junction (MTJ) structure having faceted sidewalls is formed on a conductive landing pad that is present on a surface of an electrically conductive structure embedded in a dielectric material layer. No metal ions are re-sputtered onto the sidewalls of the MTJ structure during the patterning of the MTJ material stack that provides the MTJ structure. The absence of re-sputtered metal on the MTJ structure sidewalls reduces the risk of shorts.

In one aspect of the present application, a semiconductor structure including an embedded high performance MRAM device is provided. In one embodiment of the present application, the semiconductor structure includes an electrically conductive structure embedded in a dielectric material layer and present in a MRAM device area. A conductive landing pad is located on a surface of the electrically conductive structure, and a magnetic tunnel junction (MTJ) structure having faceted sidewalls is located on a surface of the conductive landing pad. A MTJ encapsulating dielectric layer is located on the dielectric material layer and laterally surrounds the MTJ structure, and an electrically conductive metal-containing layer is located on the MTJ structure.

In another aspect of the present application, a method of forming a semiconductor structure including an embedded high performance MRAM device is provided. In one embodiment, the method includes forming a structure including an electrically conductive structure embedded in a dielectric material layer, wherein a conductive landing pad is located on a surface of the electrically conductive structure and wherein a patterned dielectric capping layer having tapered sidewalls and an opening that physically exposes a surface of the conductive landing pad is located above the dielectric material layer. At least a MTJ reference material layer is formed in the opening, wherein the MTJ reference material layer has a topmost surface that is coplanar with a topmost surface of the patterned dielectric capping layer. Next, and after forming of the MTJ reference material layer, a tunnel barrier layer, a free layer, and a capping layer are formed on the MTJ reference material layer and the topmost surface of the patterned dielectric capping layer. The capping layer, the free layer, the tunnel barrier layer, the MTJ reference material layer are then patterned to provide a MTJ structure having faceted sidewalls.

DETAILED DESCRIPTION

Figure 1:
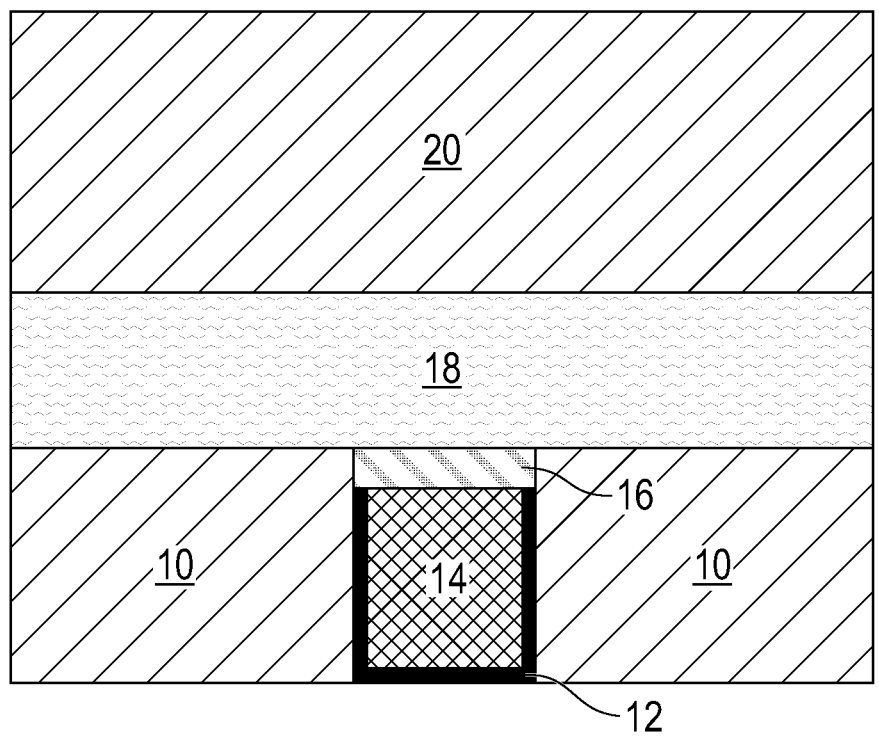
FIG. 1 is a cross sectional view of an exemplary semiconductor structure of the present application during an early stage of fabrication, and including a dielectric material stack of, and from bottom to top, a dielectric material layer, a dielectric capping layer and an ultra-low k dielectric layer, wherein an electrically conductive structure is embedded in the dielectric material layer, and wherein a conductive landing pad is located on a surface of the electrically conductive structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) device (i.e., memory cell) for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of the MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ storage element results in a change to the MTJ resistance, hence the name "Magnetoresistive" RAM.

Referring now to FIG. 1, there is illustrated an exemplary semiconductor structure of the present application during an early stage of fabrication, and including a dielectric material stack of, and from bottom to top, a dielectric material layer 10, a dielectric capping layer 18 and an ultra-low k dielectric layer 20, wherein an electrically conductive structure 14 is embedded in the dielectric material layer 10, and wherein a conductive landing pad 16 is located on a surface of the electrically conductive structure 14. It is noted that the present application illustrates a device area (i.e., a MRAM device area) in which a high performance embedded MRAM device containing a magnetic tunnel junction (MTJ) structure will be subsequently formed. Other device areas such as, for example, logic device areas, may be located laterally adjacent to the MRAM device area shown in the drawings.

In one embodiment, and as is illustrated in FIG. 1, the conductive landing pad 16 is located on a recessed surface of the electrically conductive structure 14. In such an embodiment, the conductive landing pad 16 and the electrically conductive structure 14 are both embedded in the dielectric material layer 10. In another embodiment (not shown), the conductive landing pad 16 is located on a non-recessed surface of electrically conductive structure 14. In such an embodiment, the electrically conductive structure 14 is embedded in the dielectric material layer 10 and the conductive landing pad 16 is embedded in the dielectric capping layer 18.

The dielectric material layer 10 may include an inorganic dielectric material or an organic dielectric material. In one embodiment, the dielectric material layer 10 may be non-porous. In another embodiment, the dielectric material layer 10 may be porous. Some examples of suitable dielectric materials that may be used as dielectric material layer 10 include, but are not limited to, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material layer 10 may vary depending upon the type of dielectric material(s) used. In one example, the dielectric material layer 10 may have a thickness from 50 nm to 1000 nm. Other thicknesses that are lesser than, or greater than, the aforementioned thickness range may also be employed in the present application for the thickness of the dielectric material layer 10. The dielectric material layer 10 may be formed utilizing any deposition process including, but not limited to, chemical vapor deposition (CVD), plasma enhanced chemical vapor deposition (PECVD) or spin-on coating.

The dielectric material layer 10 is then processed to include at least one opening (not shown). A single opening and/or a plurality of openings can be formed. In the illustrated embodiment of FIG. 1, a single opening is formed into the dielectric material layer 10. The opening, which is used to house, the electrically conductive structure 14, may extend partially through the dielectric material layer 10 (not illustrated in the embodiment of FIG. 1) or entirely through the dielectric material layer 10 (as illustrated in FIG. 1). The opening may be a via opening, a line opening or a combined via/line opening. The opening may be formed by lithography and etching.

In some embodiments, and prior to forming the opening, a hard mask material layer (not shown) is formed on the dielectric material layer 10. The hard mask material may be composed of a dielectric oxide, a dielectric nitride and/or a dielectric oxynitride. In one example, the hard mask material may be composed of silicon dioxide and/or silicon nitride. The hard mask material layer may be formed utilizing a deposition process such as, for example, chemical vapor deposition (CVD) or plasma enhanced chemical vapor deposition (PECVD). An opening (as defined above) can then be formed through the hard mask material layer and into the dielectric material layer 10 by lithography and etching. The thus patterned hard mask material layer may be removed after forming the openings utilizing any well known material removal process.

A diffusion barrier material layer may then be formed into each opening and above a topmost surface of the dielectric material layer 10. In some embodiments, the formation of a diffusion barrier material layer may be omitted. When present, the diffusion barrier material layer includes a diffusion barrier material (i.e., a material that serves as a barrier to prevent a conductive material such as copper from diffusing there through) such as, for example, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed; the diffusion barrier material layer does not fill in an entirety of the opening that is formed into the dielectric material layer 10. In some embodiments, the diffusion barrier material layer may have a thickness from 2 nm to 50 nm; although other thicknesses for the diffusion barrier material layer are contemplated and can be employed in the present application. The diffusion barrier material layer can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

An electrically conductive metal or metal alloy is formed into each opening. In some embodiments, the electrically conductive metal or metal alloy is present on the diffusion barrier material layer. In other embodiments, the electrically conductive metal or metal alloy is present above the topmost surface of the dielectric material layer 10. Examples of electrically conductive metals that may be used in the present application include copper (Cu), aluminum (Al), or tungsten (W), while an example of an electrically conductive metal alloy is a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy.

Following the deposition of the electrically conductive metal or metal alloy, a planarization process such as, for example, chemical mechanical polishing (CMP) and/or grinding, can be used to remove the electrically conductive metal or metal alloy (i.e., overburden material) and, if present, the diffusion barrier material layer that is present outside each of the openings and from the topmost surface of the dielectric material layer 10. The electrically conductive metal or metal alloy remaining in each opening is referred to herein as electrically conductive structure 14, while the diffusion barrier material layer that remains in each opening is referred to herein as diffusion barrier liner 12. The planarization stops on the topmost surface of the dielectric material layer 10. At this point of the present application, the electrically conductive structure 14 has a topmost surface that is coplanar with the topmost surface of the dielectric material layer 10, as well as, the topmost surfaces of the diffusion barrier liner 12.

In some embodiments, the dielectric material layer 10, if present, the diffusion barrier liner 12, and the electrically conductive structure 14 form an interconnect level. In such an embodiment, copper or a copper alloy is typically used in providing the electrically conductive structure 14. In other embodiments, the dielectric material layer 10, if present, the diffusion barrier liner 12, and the electrically conductive structure 14 form a middle-of-the-line (MOL) level. In such an embodiment, tungsten is typically used in providing the electrically conductive structure 14.

A conductive landing pad 16 is then formed on a surface of the electrically conductive structure 14, and if present, the diffusion barrier liner 12. In one embodiment (and as shown in FIG. 1), the conductive landing pad 16 is formed on a recessed surface of the electrically conductive structure 14, and if present, the diffusion barrier liner 12. In such an embodiment, the electrically conductive structure 14, and if present, the diffusion barrier liner 12 are recessed utilizing a recess etching process. After recessing, and as is shown in FIG. 1, the electrically conductive structure 14, and if present, the diffusion barrier liner 12, have topmost surfaces that are located beneath the topmost surface of the dielectric material layer 10. In another embodiment (not illustrated), the conductive landing pad 16 is formed on a non-recessed surface of the electrically conductive structure 14, and if present, the diffusion barrier liner 12.

The conductive landing pad 16 may be composed of Ta, TaN, Ti, TiN, Ru, RuN, RuTa, RuTaN, Co, CoWP, CoN, W, WN or any combination thereof. The conductive landing pad 16 may have a thickness from 2 nm to 25 nm; other thicknesses are possible and can be used in the present application as the thickness of the conductive landing pad 16. The conductive landing pad 16 may be formed by a deposition process such as, for example, sputtering, ALD, CVD or PVD. An etch back process, a planarization process (such as, for example, chemical mechanical polishing), or a patterning process (such as, for example, lithography and etching) may follow the deposition of the conductive material that provides the conductive landing pad 16. In some embodiments and as illustrated in FIG. 1, the conductive landing pad 16 has a topmost surface that is coplanar with the topmost surface of the dielectric material layer 10. In other embodiments (not shown), the conductive landing pad 16 has a topmost surface that is above the topmost surface of the dielectric material layer 10.

Dielectric capping layer 18, which is formed on the dielectric material layer 10 and the conductive landing pad 16, is composed of a dielectric material that is compositionally different from the dielectric material that provides the dielectric material layer 10 and the dielectric material that provides the ultra-low k dielectric layer 20. The dielectric capping layer 18 may be composed of SiC, $Si_3N_4$, $SiO_2$, a carbon doped oxide, a nitrogen and hydrogen doped silicon carbide SiC(N,H) or multilayers thereof. The dielectric capping layer 18 can be formed utilizing a conventional deposition process such as, for example, CVD, PECVD, chemical solution deposition, evaporation, or ALD. The thickness of the dielectric capping layer 18 may vary depending on the technique used to form the same as well as the material make-up of the layer. In one example, the dielectric capping layer 18 may have a thickness from 15 nm to 100 nm. Other thicknesses that are lesser than 15 nm, or greater 100 nm may also be employed as the thickness of the dielectric capping layer 18.

Ultra-low k dielectric layer 20 has a dielectric constant of less than 2.8 and is composed of a dielectric material (porous or non-porous) that is compositionally different from the dielectric capping layer 18; the ultra-low k dielectric layer 20 may be composed of a same dielectric material as the dielectric material layer 10. In one embodiment, the ultra-low k dielectric layer 20 is composed of a C doped oxide (i.e., organosilicate) that includes atoms of Si, C, 0 and H. The ultra-low k dielectric layer 20 may be formed utilizing one of the deposition processes mentioned above for forming the dielectric material layer 10. The ultra-low k dielectric layer 20 may have a thickness within the thickness range mentioned above for the dielectric material layer 10.

Figure 2:
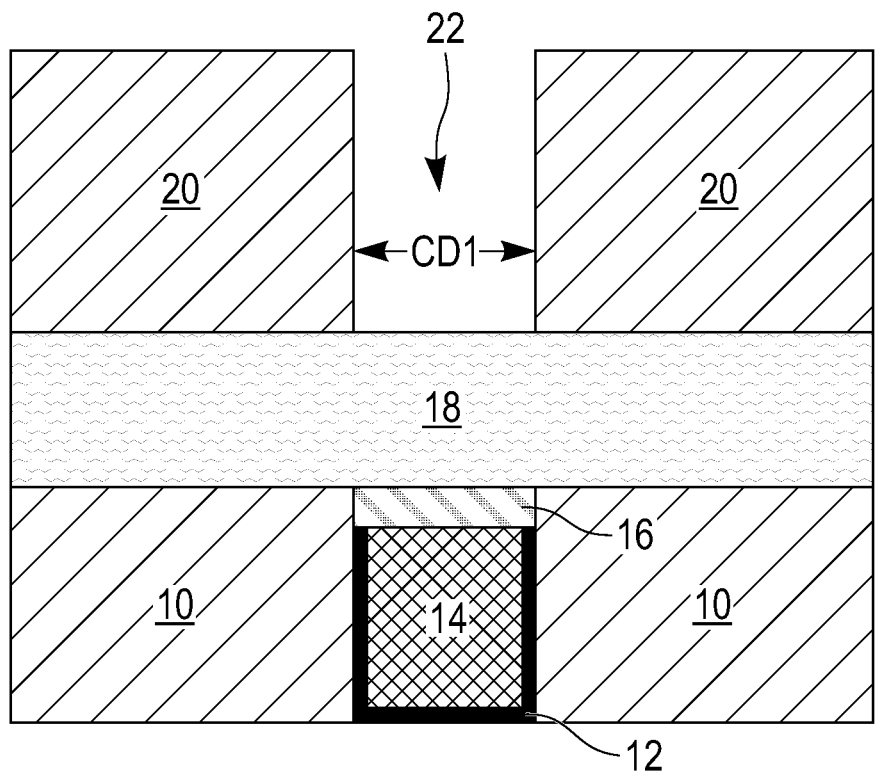
FIG. 2 is a cross sectional view of the exemplary semiconductor structure of FIG. 1 after forming a via opening in the ultra-low k dielectric layer.

Referring now FIG. 2, there is illustrated the exemplary semiconductor structure of FIG. 1 after forming a via opening 22 in the ultra-low k dielectric layer 20. The via opening 22 can be formed by lithography and etching. As is illustrated in FIG. 2, the etch stops on the dielectric capping layer 18. In one embodiment, the etch used to form the via opening 22 can include a reactive ion etch (RIE). The via opening 22 may have a first critical dimension, CD1, from 10 nm to 200 nm.

Figure 3:
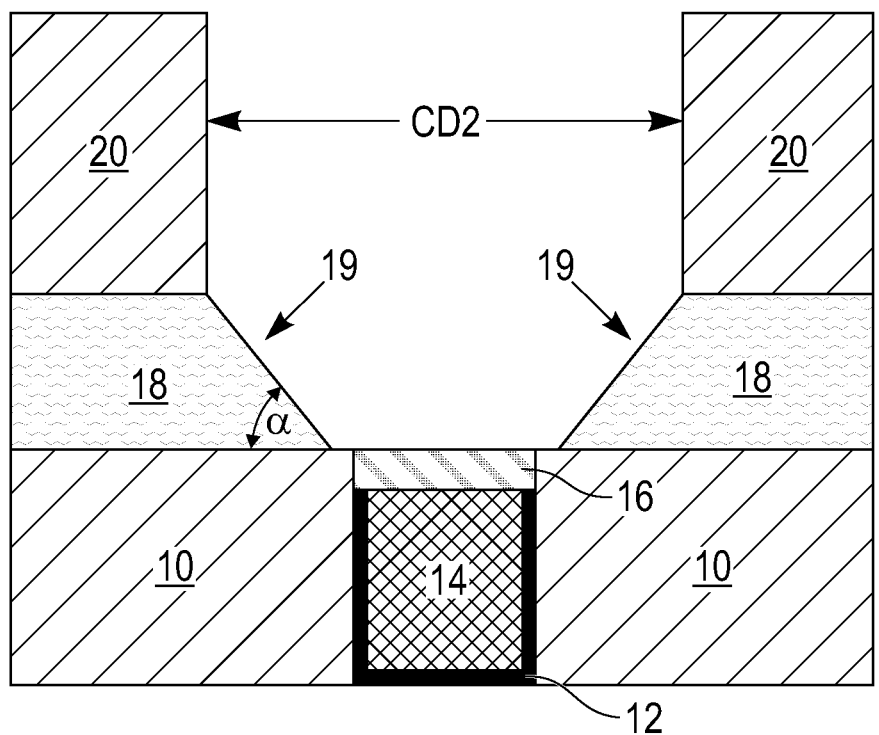
FIG. 3 is a cross sectional view of the exemplary semiconductor structure of FIG. 2 after performing a reactive ion etch to transfer the via opening into the dielectric capping layer, wherein the reactive ion etch widens the critical dimension of the via opening in the ultra low-k dielectric layer and provides a patterned dielectric capping layer having tapered sidewalls and an opening that physically exposes a surface of the conductive landing pad.

Referring now to FIG. 3, there is illustrated the exemplary semiconductor structure of FIG. 2 after performing a reactive ion etch (RIE) to transfer the via opening 22 into the dielectric capping layer 18. The RIE used in this step of the present application differs from a RIE etch that can be used to provide the via opening 22 into the ultra-low k dielectric layer 20. The RIE that is used to transfer the via opening 22 into the dielectric capping layer 18 widens the critical dimension of the via opening 22 in the ultra low-k dielectric layer 20 and provides a patterned dielectric capping layer 18 having tapered sidewalls 19 and an opening that physically exposes a surface of the conductive landing pad 16; the opening is labeled as element 23 in FIG. 4 of the present opening. Opening 23 has a tapered profile defined by the tapered sidewalls 19 of the patterned dielectric capping layer 18.

The widened critical dimension, which may be referred to as a second critical dimension, CD2, is greater than the first critical dimension, CD1, of via opening 22 mentioned above. In one embodiment, this second critical dimension, CD2, of the patterned ultra-low k dielectric layer 20 can be from 20 nm to 300 nm.

Each tapered sidewall 19 that is provided by this RIE slopes outward from a topmost surface to the bottommost surface of the patterned dielectric capping layer 18. Thus, the opening 23 that is provided in the dielectric capping layer 18 decreases from the topmost surface of the patterned dielectric capping layer 18 to the bottommost surface of the patterned dielectric capping layer 18. The angle, a, which is the angle formed by the bottommost surface of the patterned dielectric capping layer 18 and the tapered sidewall 19 emanating from the point of intersection (i.e., the vertex) of these two rays, can be from 30° to 70°.

Figure 4:
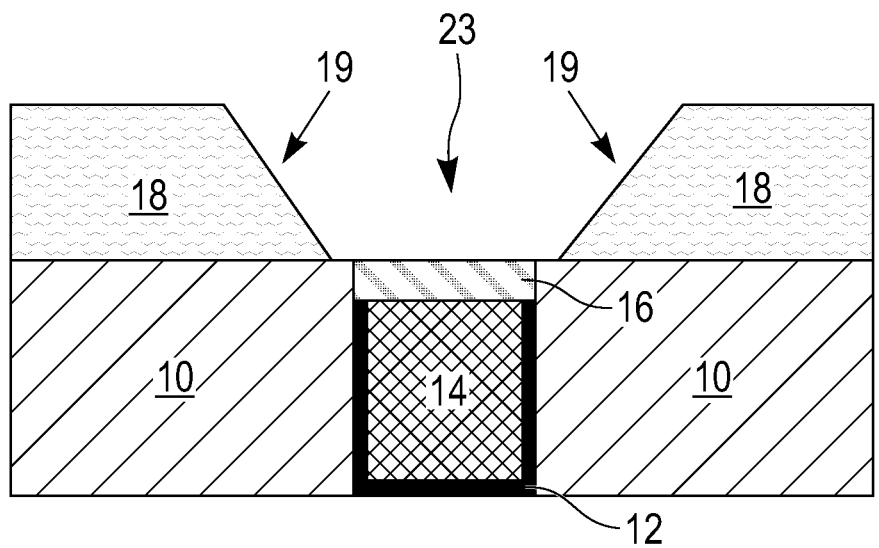
FIG. 4 is a cross sectional view of the exemplary semiconductor structure of FIG. 3 after removing the ultra-low k dielectric layer.

Referring now to FIG. 4, there is illustrated the exemplary semiconductor structure of FIG. 3 after removing the ultra-low k dielectric layer 20. The ultra-low k dielectric layer 20 can be removed utilizing any material removal process such as, for example, etching or planarization, that is selective in removing the ultra-low k dielectric layer 20. In one embodiment, a RIE is used to remove the ultra-low k dielectric layer 20. In FIG. 4, element 23 denotes the opening having a tapered profile, as defined by the tapered sidewalls 19, that is formed in the patterned dielectric capping layer 18.

Figure 5:
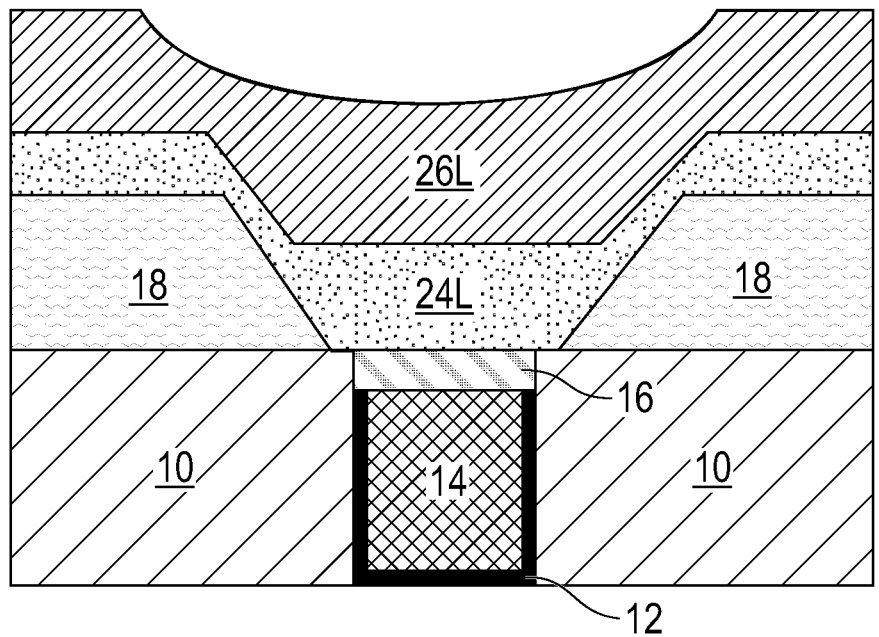
FIG. 5 is a cross sectional view of the exemplary semiconductor structure of FIG. 4 after forming a synthetic anti-ferromagnetic (SAF) layer and a reference layer on the patterned dielectric capping layer and within the opening having the tapered profile.

Referring now to FIG. 5, there is illustrated the exemplary semiconductor structure of FIG. 4 after forming a synthetic anti-ferromagnetic (SAF) layer 24L and a reference layer 26L on the patterned dielectric capping layer 18 and within the opening 23 provided in the patterned dielectric capping layer 18. In some embodiments, the SAF layer 24L can be omitted.

The SAF layer 24L has a fixed magnetization and may include a cobalt-based alloy such as for example, cobalt-platinum. The thickness of the SAF layer 24L may be from 1.5 nm 15 nm. The SAF layer 24L can be formed by utilizing a deposition process such as, for example, CVD, PECVD, PVD, or sputtering.

The reference layer 26L also has a fixed magnetization; reference layer 26L may be referred to as magnetic reference layer. The reference layer 26 may be composed of a metal or metal alloy that includes one or more metals exhibiting high spin polarization. In alternative embodiments, exemplary metals for the formation of the reference layer 32 include iron, nickel, cobalt, chromium, boron, and manganese. Exemplary metal alloys may include the metals exemplified by the above. In another embodiment, the reference layer 32 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The thickness of the reference layer 26L will depend on the material selected. In one example, the reference layer 26L may have a thickness from 0.3 nm to 3 nm. The reference layer 26L can be formed by utilizing a deposition process such as, for example, CVD, PECVD, PVD, or sputtering.

Figure 6:
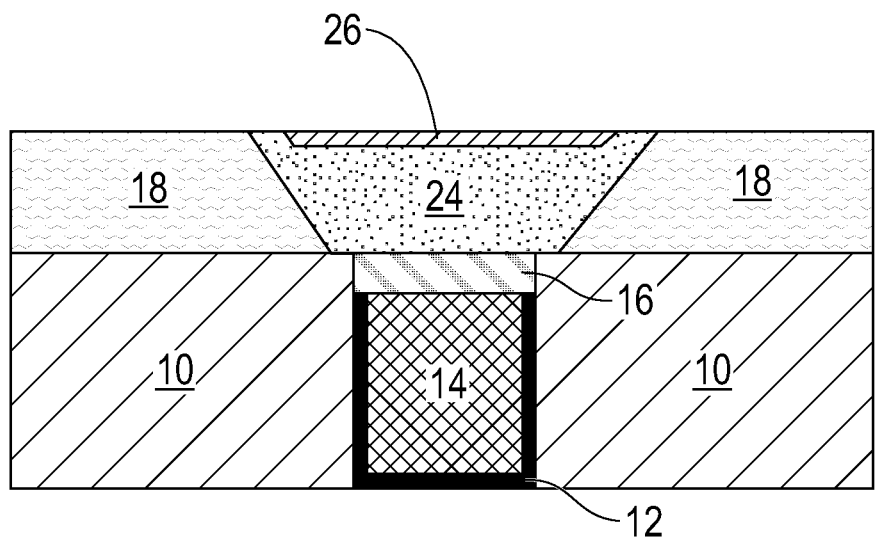
FIG. 6 is a cross sectional view of the exemplary semiconductor structure of FIG. 5 after removing the reference layer and the SAF layer that are located on a topmost surface of the patterned dielectric capping layer, while maintaining a portion of the reference layer and a portion of the SAF layer in the opening.

Referring now to FIG. 6, there is illustrated the exemplary semiconductor structure of FIG. 5 after removing the reference layer 26L and the SAF layer 24L that are located on the topmost surface of the patterned dielectric capping layer 18, while maintaining a portion of the reference layer 26L and a portion of the SAF layer 24L in the opening 23 formed in the patterned dielectric capping layer 18. The remaining portion of the reference layer 26L may be referred to as a MTJ reference material layer 26, while the remaining portion of the SAF layer may be referred to as a MTJ SAF material layer 24. The removal of the reference layer 26L and the SAF layer 24L that are located on a topmost surface of the patterned dielectric capping layer 18 can be performed utilizing a planarization process such as, for example, chemical mechanical polishing (CMP) and/or grinding.

As is illustrated, the metal layers defined by the MTJ SAF material layer 24 (if present) and the MTJ reference material layer 26 are embedded in the patterned dielectric capping layer 18 and are located on the conductive landing pad 16. No metal layers defined by the MTJ SAF material layer 24 (if present) and the MTJ reference material layer 26 span across the wafer thus eliminating the possibility of re-sputtering any heavy metal ions provided by the MTJ SAF material layer 24 (if present) and the MTJ reference material layer 26 onto the sidewalls of the final MTJ structure. As is further illustrated, the metal layers defined by the MTJ SAF material layer 24 (if present) and the MTJ reference material layer 26 have a topmost surface that are coplanar with each other as well as with a topmost surface of the patterned dielectric capping layer 18.

The metal layers defined by the MTJ SAF material layer 24 (if present) and the MTJ reference material layer 26 have sidewalls that taper inward from a topmost surface of the metal layer(s) to a bottommost surface of the metal layer(s). Thus, the MTJ SAF material layer 24 (if present) and the MTJ reference material layer 26 have an upper portion that has a width greater than a width of a lower portion.

Figure 7:
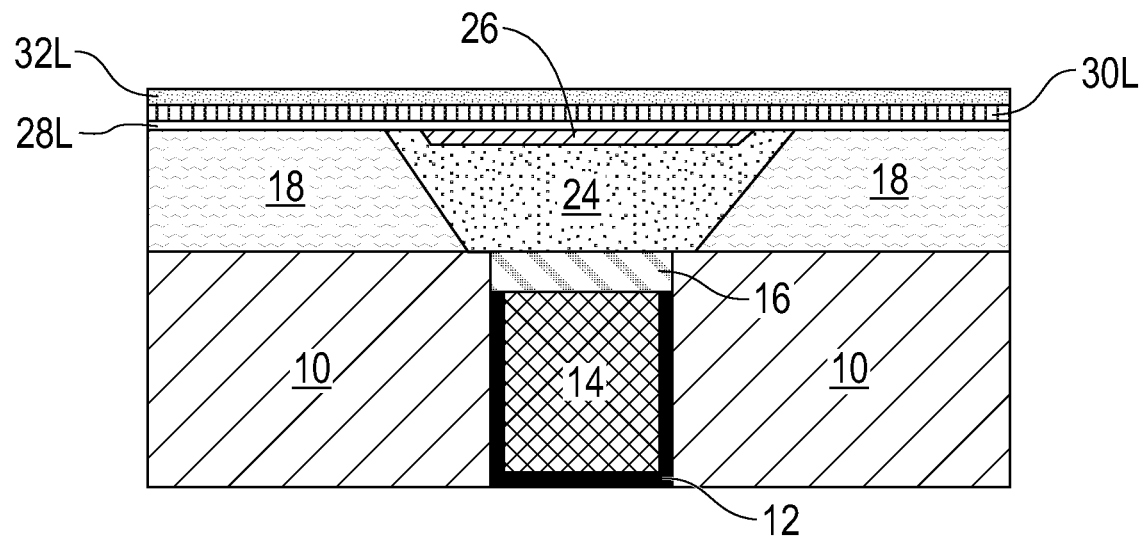
FIG. 7 is a cross sectional view of the exemplary semiconductor structure of FIG. 6 after forming a tunnel barrier layer, a free layer, and a capping layer.

Referring now to FIG. 7, there is illustrated the exemplary semiconductor structure of FIG. 6 after forming a tunnel barrier layer 28L, a free layer 30L, and a capping layer 32L. The tunnel barrier layer 28L, the free layer 30L, and the capping layer 32L are formed on the metal layers defined by the MTJ SAF material layer 24 (if present) and the MTJ reference material layer 26 as well as the topmost surface of the patterned dielectric capping layer 18.

Tunnel barrier layer 28L is composed of an insulator material and is formed at such a thickness as to provide an appropriate tunneling resistance. Exemplary materials for the tunnel barrier layer 28L include magnesium oxide, aluminum oxide, and titanium oxide, or materials of higher electrical tunnel conductance, such as semiconductors or low-bandgap insulators. The thickness of the tunnel barrier layer 28L will depend on the material selected. In one example, the tunnel barrier layer 28L may have a thickness from 0.5 nm to 1.5 nm. The tunnel barrier layer 28L can be formed by utilizing a deposition process such as, for example, CVD, PECVD, PVD, or sputtering.

Free layer 30L is composed of a magnetic material with a magnetization that can be changed in orientation relative to the magnetization orientation of the synthetic anti-ferromagnetic (SAF) layer 24L and the reference layer 26L. Exemplary materials for the free layer 30L include alloys and/or multilayers of cobalt, iron, alloys of cobalt-iron, nickel, alloys of nickel-iron, and alloys of cobalt-iron-boron. The free layer 30L may have a thickness from 0.3 nm to 3 nm. The free layer 30L can be formed by utilizing a deposition process such as, for example, CVD, PECVD, PVD, or sputtering.

Capping layer 32L may include one or more different kinds of oxides. Exemplary oxide materials for the capping layer 32L include metal oxides such oxides of aluminum, oxides of magnesium, oxides of magnesium and titanium, oxides of magnesium and tantalum, oxides of titanium, oxides of tantalum, oxides of tungsten, oxides of iridium, oxides of zirconium, and oxides of ruthenium, among others. In one example, the capping layer 32L includes tantalum oxide and/or ruthenium oxide. In yet other embodiments, the capping layer 32L includes a metal cap such as for example, tantalum and/or ruthenium. The capping layer 32L may have a thickness from 0.5 nm to 2 nm. The capping layer 32L can be formed by utilizing a deposition process such as, for example, CVD, PECVD, PVD, or sputtering.

Figure 8:
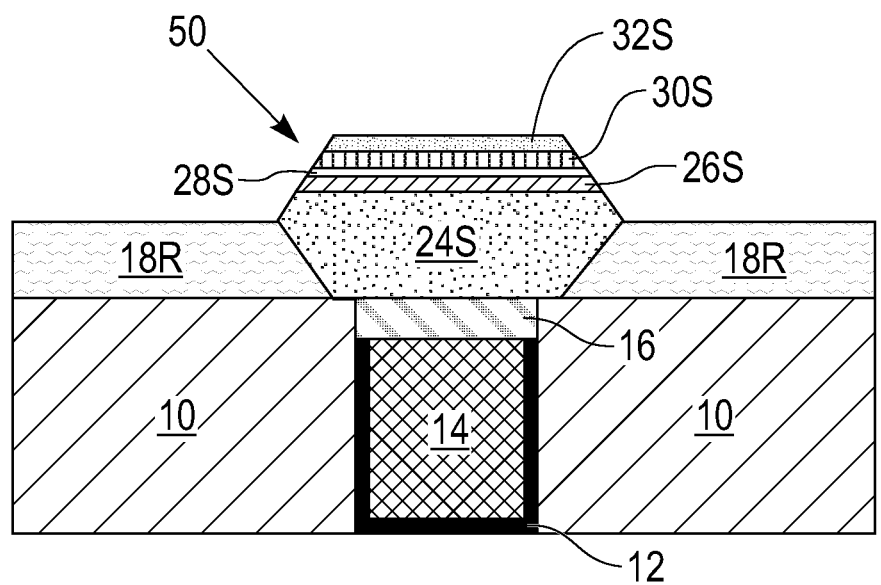
FIG. 8 is a cross sectional of the exemplary semiconductor structure of FIG. 7 after patterning of the capping layer, the free layer, the tunnel barrier layer, the remaining portion of the reference layer, and the remaining portion of the SAF layer to provide a MTJ structure having faceted sidewalls.

Referring now to FIG. 8, there is illustrated the exemplary semiconductor structure of FIG. 7 after patterning of the capping layer 32L, the free layer 30L, the tunnel barrier layer 28L, the remaining portion of the reference layer (i.e., MTJ reference material layer 26) and, if present, the remaining portion of the SAF layer (i.e., MTJ SAF material layer 24) to provide a MTJ structure 50 having faceted sidewalls. By "faceted sidewalls" it is meant that the sidewalls of the MTJ structure 50 are non-perpendicular to the topmost (horizontal) surface of the dielectric material layer 10. In some embodiments, the MTJ structure 50 has a truncated bi-cone shape (MTJ structure 50), i.e., exhibiting geometrical symmetry about the upper plane of dielectric 18R, forming a cone shape on either side of this plane (bi-cone), while having been truncated.

The patterning of the capping layer 32L, the free layer 30L, the tunnel barrier layer 28L, the remaining portion of the reference layer (i.e., MTJ reference material layer 26) and, if present, the remaining portion of the SAF layer (i.e., MTJ SAF material layer 24) includes first depositing a hard mask (not shown), as defined above, on a topmost surface of the capping layer 32, and then depositing a photoresist material (also not shown) on the hard mask. An opening is formed into the deposited photoresist material utilizing lithography. After providing the opening into the deposited photoresist material, reactive ion etching is used to transfer the pattern provided by the opening formed into the deposited photoresist material into the underlying hard mask. In one embodiment, the reactive ion etch stops on the capping layer 32L. After the aforementioned reactive ion etch, the patterned photoresist is removed from the structure utilizing a conventional resist stripping process well known to those skilled in the art. Next, ion beam etching is used to pattern the capping layer 32L, the free layer 30L, the tunnel barrier layer 28L, the remaining portion of the reference layer (i.e., MTJ reference material layer 26) and, if present, the remaining portion of the SAF layer (i.e., MTJ SAF material layer 24) to provide MTJ structure 50 having faceted sidewalls. In some embodiments, reactive ion etch is used to also pattern the capping layer 32L, the free layer 30L, and the tunnel barrier layer 28L. The patterned hard mask is removed after ion beam etching. During the removal of the patterned hard mask, an upper portion of the patterned dielectric capping layer 18 may be removed. In FIG. 8, element 18R denotes a recessed dielectric capping layer that remains.

The MTJ structure 50 includes a remaining portion of the capping layer 32L (hereinafter MTJ capping layer 32S), a remaining portion of the free layer 30L (hereinafter MTJ free layer 30S), a remaining portion of the tunnel barrier layer 28L (hereinafter MTJ tunnel barrier layer 28S), a remaining portion of the MTJ reference material layer 26 (hereinafter MTJ reference layer 26S) and, if present, a remaining portion of the MTJ SAF material layer 24 (hereinafter MTJ SAF layer 24S).

Figure 9:
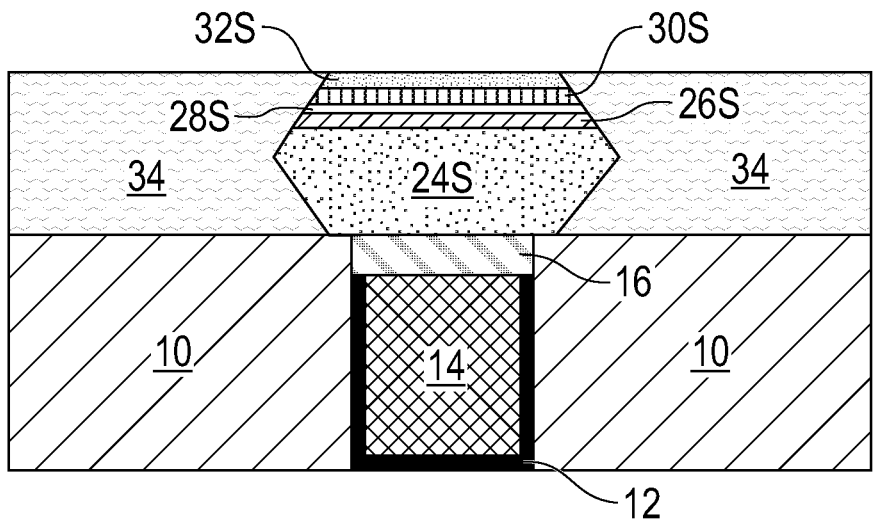
FIG. 9 is a cross sectional view of the exemplary semiconductor structure of FIG. 8 after forming addition dielectric capping material to provide a MTJ encapsulating dielectric capping layer that embeds the MTJ structure.

Referring now to FIG. 9, there is illustrated the exemplary semiconductor structure of FIG. 8 after forming addition dielectric capping material to provide a MTJ encapsulating dielectric capping layer 34 that embeds the MTJ structure 50. The additional dielectric capping material includes a same, or different dielectric capping material as dielectric capping layer 18. The additional capping layer is formed on the recessed dielectric capping layer 18R and on physically exposed surface of the MTJ structure 50. The additional dielectric capping layer is then planarized by chemical mechanical polishing and/or grinding to provide the MTJ encapsulating dielectric capping layer 34; MTJ encapsulating dielectric capping layer 34 includes the recessed dielectric capping layer 18R and a remaining portion of the additional dielectric capping layer.

As is illustrated in FIG. 9, the MTJ encapsulating dielectric capping layer 34 laterally surrounds the MTJ structure 50 and has a topmost surface that is coplanar with a topmost surface of the MTJ structure 50. Thus, the MTJ structure 50 is embedded in the MTJ encapsulating dielectric capping layer 34 and has a bottommost surface that is located on the conductive landing pad 16.

Figure 10:
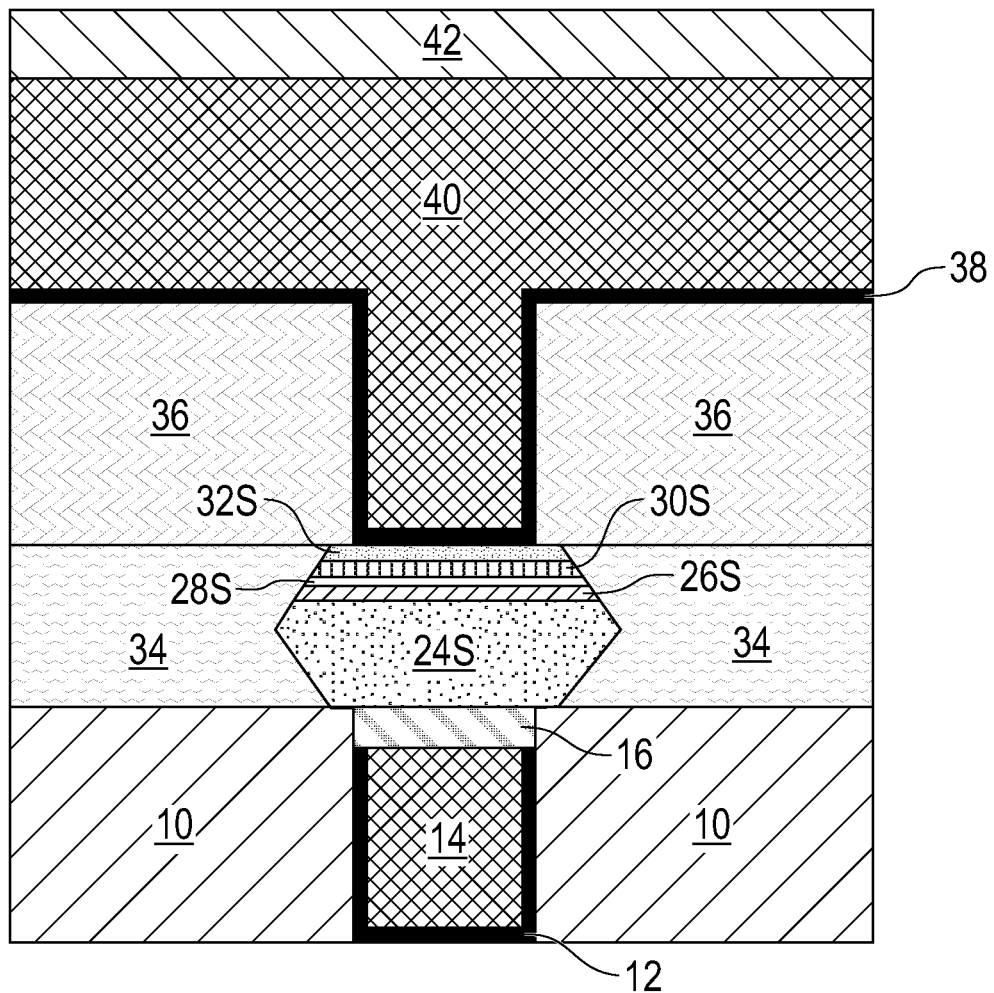
FIG. 10 is a cross sectional view of the exemplary semiconductor structure of FIG. 9 after performing back-end-of-the-line processing.

Referring now to FIG. 10, there is illustrated the exemplary semiconductor structure of FIG. 9 after performing back-end-of-the-line processing. The BEOL processing includes forming an interconnect dielectric material layer 36 on the exemplary structure shown in FIG. 9. The interconnect dielectric material layer 36 may include one of the dielectric materials mentioned above for the dielectric material layer 10. In one embodiment, the interconnect dielectric material layer 36 is composed of a same dielectric material as the dielectric material layer 10. In another embodiment, the interconnect dielectric material layer 36 is composed of a different dielectric material than the dielectric material layer 10. The interconnect dielectric material layer 36 may be formed by utilizing one of the deposition processes mentioned above in forming the dielectric material layer 10. The interconnect dielectric material layer 36 may have a thickness within the thickness range mentioned above for the dielectric material layer 10.

An opening is then formed into the interconnect dielectric material layer 36. The opening can be formed by lithography and etching. The opening physically exposes a topmost surface of the MTJ structure, i.e., the MTJ capping layer 32S. A material stack of a diffusion barrier material layer 38 and an electrically conductive metal-containing layer 40 is then formed on the physically exposed topmost surface of the interconnect dielectric material layer 36 and within the opening.

The diffusion barrier material layer 38 may include one of the diffusion barrier materials mentioned above for diffusion barrier liner 12. In one embodiment, diffusion barrier material layer 38 is composed of a same diffusion barrier material as diffusion barrier liner 12. In another embodiment, diffusion barrier material layer 38 is composed of a different diffusion barrier material than diffusion barrier liner 12. Diffusion barrier material layer 38 may be deposited utilizing one of the deposition processes mentioned above in forming diffusion barrier liner 12. Diffusion barrier material layer 38 may have a thickness within the thickness range mentioned above for diffusion barrier liner 12.

The electrically conductive metal-containing layer 40 may include one of the electrically conductive metals or metal alloys mentioned above for the electrically conductive structure 14. In one embodiment, electrically conductive metal-containing layer 40 is composed of a same electrically conductive metal or metal alloy as the electrically conductive structure 14. In another embodiment, electrically conductive metal-containing layer 40 is composed of a different electrically conductive metal or metal alloy than the electrically conductive structure 14. Electrically conductive metal-containing layer 40 may be deposited utilizing one of the deposition processes mentioned above in forming the electrically conductive structure 14.

Dielectric cap 42 is then formed on electrically conductive metal-containing layer 40. The dielectric cap 42 may include one of the dielectric capping materials mentioned above for dielectric capping layer 18. In one embodiment, dielectric cap 42 is composed of a same dielectric capping material as dielectric capping layer 18. In another embodiment, dielectric cap 42 is composed of a different dielectric capping material than dielectric capping layer 18. Dielectric cap 42 may be deposited utilizing one of the deposition processes mentioned above in forming dielectric capping layer 18. Dielectric capping layer 42 may have a thickness within the thickness range mentioned above for dielectric capping layer 18.

FIG. 10 illustrates an exemplary semiconductor structure of the present application. Notably, the structure illustrated in FIG. 10 includes an electrically conductive structure 14 embedded in a dielectric material layer 10 and present in a MRAM device area. A conductive landing pad 16 is located on a surface of the electrically conductive structure 14, and a magnetic tunnel junction (MTJ) structure 50 having faceted sidewalls is located on a surface of the conductive landing pad 16. A MTJ encapsulating dielectric layer 34 is located on the dielectric material layer 10 and laterally surrounds the MTJ structure 50, and an electrically conductive metal-containing layer 40 is located on the MTJ structure 50. As is illustrated, the MTJ encapsulating dielectric layer 34 has a topmost surface that is coplanar with a topmost surface of the MTJ structure 50. The MTJ structure may include a MTJ SAF layer 24S, a MTJ reference layer 26S, a MTJ tunnel barrier 28S, a MTJ free layer 30S, and a MTJ capping layer 32S. In some embodiments, the MTJ SAF layer 24S is omitted from the MTJ structure 50.

Due to the method described above, no metal ions are re-sputtered onto the sidewalls of the MTJ structure 50 during the patterning of the MTJ material stack that provides the MTJ structure 50. The absence of re-sputtered metal on the MTJ structure 50 sidewalls reduces the risk of shorts.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:

forming a structure including an electrically conductive structure embedded in a dielectric material layer, wherein a conductive landing pad is located on a surface of the electrically conductive structure and wherein a patterned dielectric capping layer having tapered sidewalls and an opening that physically exposes a surface of the conductive landing pad is located above the dielectric material layer;

forming at least a magnetic tunnel junction (MTJ) reference material layer in the opening, wherein the MTJ reference material layer has a topmost surface that is coplanar with a topmost surface of the patterned dielectric capping layer;

forming, after the forming of the MTJ reference material layer, a tunnel barrier layer, a free layer, and a capping layer on the MTJ reference material layer and the topmost surface of the patterned dielectric capping layer; and patterning of the capping layer, the free layer, the tunnel barrier layer, the MTJ reference material layer to provide a MTJ structure having faceted sidewalls.

2. The method of claim 1, wherein the forming of at least the MTJ reference material layer includes the forming of a MTJ synthetic anti-ferromagnetic (SAF) material layer.

3. The method of claim 1, wherein the providing the structure comprises:

providing a dielectric material stack of, and from bottom to top, the dielectric material layer, a dielectric capping layer and an ultra-low k dielectric layer, wherein the electrically conductive structure is embedded in the dielectric material layer;

forming a via opening in the ultra-low k dielectric layer;

performing a reactive ion etch to transfer the via opening into the dielectric capping layer, wherein the reactive ion etch widens a critical dimension of the via opening in the ultra low-k dielectric layer and provides the patterned dielectric capping layer; and removing the ultra-low k dielectric layer.

4. The method of claim 1, wherein the forming of at least the MTJ reference material layer comprises:

depositing a reference layer in the opening and on a topmost surface of the patterned dielectric capping layer; and removing the reference layer from the topmost surface of the patterned dielectric capping layer utilizing a planarization process.

5. The method of claim 1, wherein the patterning of the capping layer, the free layer, the tunnel barrier layer, the MTJ reference material layer comprises:

depositing a hard mask on a topmost surface of the capping layer;

forming a patterned photoresist material having an opening on the hard mask;

transfer, via reactive ion etching, the opening into the hard mask;

removing the patterned photoresist;

ion beam etching the capping layer, the free layer, the tunnel barrier layer, and the MTJ reference material layer to provide the MTJ structure.

6. The method of claim 5, wherein during ion beam etching an upper portion of the patterned dielectric capping layer is removed, and wherein an additional dielectric capping material is formed on a remaining bottom portion of the patterned dielectric capping layer to provide a MTJ encapsulating dielectric layer laterally surrounding the MTJ structure.

7. The method of claim 1, further comprising forming an electrically conductive metal-containing layer on the MTJ structure.

8. The method of claim 7, wherein the forming of the electrically conductive metal-containing layer comprises:

forming an interconnect dielectric material having an opening above the MTJ structure; and depositing that is located on the MTJ encapsulating dielectric layer the electrically conductive metal-containing layer in the opening and on a topmost surface of the interconnect dielectric material.

9. The method of claim 8, further comprising forming a dielectric cap on a topmost surface of the electrically conductive metal-containing layer.

* * * * *